United States Patent
Cao

(10) Patent No.: US 7,362,174 B2
(45) Date of Patent: Apr. 22, 2008

(54) CURRENT-CONTROLLED CMOS (C3MOS) WIDEBAND INPUT DATA AMPLIFIER FOR REDUCED DIFFERENTIAL AND COMMON-MODE REFLECTION

(75) Inventor: Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 87 days.

(21) Appl. No.: 11/320,402

(22) Filed: Dec. 28, 2005

(65) Prior Publication Data

US 2007/0024369 A1   Feb. 1, 2007

Related U.S. Application Data

(60) Provisional application No. 60/703,908, filed on Jul. 29, 2005.

(51) Int. Cl.
H03F 3/45 (2006.01)
(52) U.S. Cl. ...................................... 330/253
(58) Field of Classification Search ............... None
See application file for complete search history.

(56) References Cited

U.S. PATENT DOCUMENTS

| | | | |
|---|---|---|---|
| 3,569,732 A | 3/1971 | Christensen | |
| 4,333,020 A | 6/1982 | Maeder | |
| 4,395,774 A | 7/1983 | Rapp | |
| 4,449,248 A | 5/1984 | Leslie et al. | |
| 4,519,068 A | 5/1985 | Krebs et al. | |

(Continued)

FOREIGN PATENT DOCUMENTS

EP   0685933   6/1995

(Continued)

OTHER PUBLICATIONS

Masakazu Yamashina, Masayuki Mizuno, Koichiro Furuta, Hiroyuki Igura, Masahiro Nomura, Hiroshi Abiko, Kazuhiro Okabe, Atsuki Ono and Hachiro Yamada, "A Low-Supply Voltage GHz MOS Integrated Circuit for Mobile Computing Systems," IEEE Symposium On Low Power Electronics, XP002386133, Oct. 1994, pp. 80-81.

(Continued)

Primary Examiner—Benny Lee
Assistant Examiner—Krista M Flanagan
(74) Attorney, Agent, or Firm—Garlick Harrison & Markison; Shayne X. Short

(57) ABSTRACT

Current-controlled CMOS (C3MOS) wideband input data amplifier for reduced differential and common-mode reflection. Impedance matching and bandwidth extension provides desired gain at higher frequencies and may be achieved at the interface between silicon and package and/or circuit board within various integrated circuits that may be employed within communication devices. In some instances, a differential transistor pair is employed that also includes Miller capacitors coupled between the gate of one transistor of the differential transistor pair to the drain of the other transistor of the differential transistor pair. This can also include series load connected resistors and inductors coupled between the respective drains of the transistors of the differential transistor pair to a power supply voltage. Also, series connected input inductors may also couple to the gates of the transistors of the differential transistor pair.

20 Claims, 10 Drawing Sheets

U.S. PATENT DOCUMENTS

| | | |
|---|---|---|
| 4,545,023 A | 10/1985 | Mizzi |
| 4,599,526 A | 7/1986 | Paski |
| 4,649,293 A | 3/1987 | Ducourant |
| 4,680,787 A | 7/1987 | Marry |
| 4,727,309 A | 2/1988 | Vajdic et al. |
| 4,731,796 A | 3/1988 | Masterson et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,806,796 A | 2/1989 | Bushey et al. |
| 4,807,282 A | 2/1989 | Kazan et al. |
| 4,817,115 A | 3/1989 | Campo et al. |
| 4,850,009 A | 7/1989 | Zook et al. |
| 4,890,832 A | 1/1990 | Komaki |
| 4,894,792 A | 1/1990 | Mitchell et al. |
| 4,916,441 A | 4/1990 | Gombrich |
| 4,954,793 A * | 9/1990 | Misu et al. ............... 333/133 |
| 4,964,121 A | 10/1990 | Moore |
| 4,969,206 A | 11/1990 | Desrochers |
| 4,970,406 A | 11/1990 | Fitzpatrick et al. |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyaski |
| 5,033,109 A | 7/1991 | Kawano et al. |
| 5,041,740 A | 8/1991 | Smith |
| 5,055,659 A | 10/1991 | Hendrick et al. |
| 5,055,660 A | 10/1991 | Bertagna et al. |
| 5,079,452 A | 1/1992 | Lain et al. |
| 5,081,402 A | 1/1992 | Koleda |
| 5,087,099 A | 2/1992 | Stolarczyk |
| 5,115,151 A | 5/1992 | Hull et al. |
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,177,378 A | 1/1993 | Nagasawa |
| 5,179,721 A | 1/1993 | Comroe et al. |
| 5,181,200 A | 1/1993 | Harrison |
| 5,196,805 A | 3/1993 | Beckwith et al. |
| 5,216,295 A | 6/1993 | Hoang |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,247,656 A | 9/1993 | Kabuo et al. |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mbey et al. |
| 5,289,055 A | 2/1994 | Razavi |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,301,196 A | 4/1994 | Ewen et al. |
| 5,323,392 A | 6/1994 | Ishii et al. |
| 5,331,509 A | 7/1994 | Kikinis |
| 5,345,449 A | 9/1994 | Buckingham et al. |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,406,615 A | 4/1995 | Miller, II et al. |
| 5,406,643 A | 4/1995 | Burke et al. |
| 5,418,837 A | 5/1995 | Johansson et al. |
| 5,420,529 A | 5/1995 | Allman et al. |
| 5,423,002 A | 6/1995 | Hart |
| 5,426,637 A | 6/1995 | Derby et al. |
| 5,428,636 A | 6/1995 | Meier |
| 5,430,845 A | 7/1995 | Rimmer et al. |
| 5,434,518 A | 7/1995 | Sinh et al. |
| 5,438,329 A | 8/1995 | Gastouniotis et al. |
| 5,440,560 A | 8/1995 | Rypinski |
| 5,457,412 A | 10/1995 | Tamba et al. |
| 5,459,412 A | 10/1995 | Mentzer |
| 5,465,081 A | 11/1995 | Todd |
| 5,481,265 A | 1/1996 | Russell |
| 5,481,562 A | 1/1996 | Pearson et al. |
| 5,491,367 A * | 2/1996 | Schinzel ................... 307/106 |
| 5,493,311 A * | 2/1996 | Itoh et al. ................. 343/860 |
| 5,510,734 A | 4/1996 | Sone |
| 5,510,748 A | 4/1996 | Erhart et al. |
| 5,521,530 A | 5/1996 | Yao et al. |
| 5,533,029 A | 7/1996 | Gardner |
| 5,535,373 A | 7/1996 | Oinowich |
| 5,544,222 A | 8/1996 | Robinson et al. |
| 5,548,230 A | 8/1996 | Gerson et al. |
| 5,576,644 A | 11/1996 | Pelella |
| 5,579,487 A | 11/1996 | Meyerson et al. |
| 5,584,048 A | 12/1996 | Wieczorek |
| 5,600,267 A | 2/1997 | Wong et al. |
| 5,606,268 A | 2/1997 | Van Brunt |
| 5,614,841 A | 3/1997 | Marbot et al. |
| 5,625,308 A | 4/1997 | Matsumoto et al. |
| 5,628,055 A | 5/1997 | Stein |
| 5,630,061 A | 5/1997 | Richter et al. |
| 5,640,356 A | 6/1997 | Gibbs |
| 5,675,584 A | 10/1997 | Jeong |
| 5,680,633 A | 10/1997 | Koenck et al. |
| 5,708,399 A | 1/1998 | Fujii et al. |
| 5,724,361 A | 3/1998 | Fiedler |
| 5,732,346 A | 3/1998 | Lazaridis et al. |
| 5,740,366 A | 4/1998 | Mahany et al. |
| 5,744,366 A | 4/1998 | Kricka et al. |
| 5,767,699 A | 6/1998 | Bosnyak et al. |
| 5,796,727 A | 8/1998 | Harrison et al. |
| 5,798,658 A | 8/1998 | Werking |
| 5,821,809 A | 10/1998 | Boerstler et al. |
| 5,839,051 A | 11/1998 | Grimmett et al. |
| 5,866,921 A | 2/1999 | Kim |
| 5,877,642 A | 3/1999 | Takahashi |
| 5,892,382 A | 4/1999 | Ueda et al. |
| 5,903,176 A | 5/1999 | Westgate |
| 5,905,386 A | 5/1999 | Gerson |
| 5,940,771 A | 8/1999 | Golnick et al. |
| 5,945,847 A | 8/1999 | Ransijn |
| 5,945,858 A | 8/1999 | Sato |
| 5,945,863 A | 8/1999 | Coy |
| 5,969,556 A | 10/1999 | Hayakawa |
| 6,002,279 A | 12/1999 | Evans et al. |
| 6,014,041 A | 1/2000 | Somasekhar et al. |
| 6,014,705 A | 1/2000 | Koenck et al. |
| 6,028,454 A | 2/2000 | Elmasry et al. |
| 6,037,841 A | 3/2000 | Tanjii et al. |
| 6,037,842 A | 3/2000 | Bryan et al. |

| | | | |
|---|---|---|---|
| 6,038,254 A | 3/2000 | Ferraiolo et al. | |
| 6,060,951 A | 5/2000 | Inoue | |
| 6,061,747 A | 5/2000 | Ducaroir et al. | |
| 6,081,162 A | 6/2000 | Johnson | |
| 6,094,074 A | 7/2000 | Chi | |
| 6,104,214 A | 8/2000 | Ueda et al. | |
| 6,111,425 A | 8/2000 | Bertin et al. | |
| 6,114,843 A | 9/2000 | Olah | |
| 6,188,339 B1 | 2/2001 | Hasegawa | |
| 6,194,950 B1 | 2/2001 | Kibar et al. | |
| 6,222,380 B1 | 4/2001 | Gerowitz et al. | |
| 6,232,844 B1 | 5/2001 | Talaga, Jr. | |
| 6,259,312 B1 | 7/2001 | Murtojarvi | |
| 6,259,320 B1 | 7/2001 | Song et al. | |
| 6,259,321 B1 | 7/2001 | Song et al. | |
| 6,265,898 B1 | 7/2001 | Bellaouar | |
| 6,265,944 B1 | 7/2001 | Conta et al. | |
| 6,310,501 B1 | 10/2001 | Yamashita | |
| 6,366,166 B1 | 4/2002 | Belot | |
| 6,374,311 B1 | 4/2002 | Mahany et al. | |
| 6,414,558 B1 | 7/2002 | Ryan et al. | |
| 6,417,737 B1 | 7/2002 | Moloudi et al. | |
| 6,424,194 B1 | 7/2002 | Hairapetian | |
| 6,463,092 B1 | 10/2002 | Kim et al. | |
| 6,566,720 B2 | 5/2003 | Aldrich | |
| 6,608,536 B2* | 8/2003 | Fallahi | 333/168 |
| 6,624,699 B2* | 9/2003 | Yin et al. | 330/260 |
| 6,774,721 B1 | 8/2004 | Popescu et al. | |
| 6,864,558 B2 | 3/2005 | Momtaz et al. | |
| 6,888,369 B1* | 5/2005 | Wang et al. | 326/30 |
| 6,949,988 B2* | 9/2005 | Fallahi | 333/168 |
| 7,109,799 B2* | 9/2006 | Yin et al. | 330/260 |
| 7,205,844 B2* | 4/2007 | Su et al. | 330/301 |
| 2002/0017921 A1 | 2/2002 | Green | |
| 2003/0034843 A1 | 2/2003 | Fanous et al. | |
| 2004/0056717 A1* | 3/2004 | Yin et al. | 330/253 |
| 2004/0104746 A1 | 6/2004 | Kim et al. | |
| 2005/0093628 A1 | 5/2005 | Chen | |

FOREIGN PATENT DOCUMENTS

| | | |
|---|---|---|
| EP | 1 306 970 A2 | 6/2002 |
| EP | 1 480 333 A2 | 11/2004 |
| WO | WO 81/01780 | 6/1981 |
| WO | WO 0163767 | 8/2001 |

OTHER PUBLICATIONS

Buhanan, "CML and Flip TAB Joint Forces in the DPS 88's Micropackages," Electronics, (Nov. 3, 1982).
Chu et al.: "A comparison of CMOS circuit techniques: Differential cascode voltage switch logic versus conventional logic" IEEE Journal of Solid-State Circuits, vol. SC-22(4) pp. 528-532, (Aug. 1987).
Gray et al., "Analysis and Design of Analog Integrated Circuits," John Wiley Sons, Inc., pp. 704-709, (1977).
Harrold, "An Introduction to GaAs IC Design," Prentice Hall International, UK Ltd., pp. 43-45, 63, 160, (1993).
Heller et al.: "Cascade voltage switch logic: A differential CMOS logic family", IEEE International Solid-State Circuits Conference, pp. 16-17 (Feb. 22, 1984).
Hodges et al., "Analysis and Design of Digital Integrated Circuits." McGraw Hill, Inc., pp. 271-283, (1983).
Katsu et al., "A GaAs Monolithic Frequency Divider Using Source Coupled FET Logic," IEEE Electron Device Letters,vol. EDL-3, No. 8, (Aug. 11982).
Katsu et al., "A Source Coupled FET Logic-A New Current-Mode Approach to GaAs Logics," IEEE Transactions on Electron Devices, vol. ED-32, No. 6, (Jun. 1985).
Lee, T. "The Design of CMOS Radio-Frequency Integrated Circuits," 1998, Cambridge Press, New York, N.Y., pp. 178-185.
Pfennings et al.: "Differential split-level CMOS logic for subnanosecond speeds", IEEE Journal of Solid-State Circuits. vol. SC-20(5), pp. 1050-1055, (Oct. 1985).
Rudell, J. et al., "A 1.9-GHz Wide-Band IF Double Conversion CMOS Receiver for Cordless Telephone Applications" IEEE Journal of Solid State Circuits, vol. 32(12) , pp. 2071-2088, Dec. 1997.
Somasekhar and Kaushik, "Differential current switch logic a power DCVS logic family" IEEE Journal of SolidState Circuits, vol. 31(7), pp. 981-991, (Jul. 1996).
Yamashina and Yamada, "An MOS current mode logic (MCML) Circuits for low-power Sub-GHz Processors" IEICE Trans. Electron., vol. E75-C(10) pp. 1181-1187, (Oct. 1992).
Yamashina and Yamada, "An MOS current mode logic (MCML) Circuit for low-power Sub-GHz Processors" NEC Res. Develop., vol. 36(1), pp. 54-63, (Jan. 1995).
Bida, A Hybrid Wireless MAC Protocol Supporting Asynchronous and Synchronous MSDU Delivery Services, IEEE 802.11191-92, Sep. 1991, pp. 1-46.
Robert Meier's Master's Thesis, Mobile Computer Network Architecture, (May 1993), 82 pages.
Hoberecht, A Layered network Protocol for Packet Voice and Data Integration, IEEE Journal on Selected Areas in Communications, vol. SAC-1, No. 6 (Dec. 1983), pp. 1006-1013.
Rypinski, Architecture-Topology and Protocol Stacks, IEEE 802.11191-21, Mar. 1991, 12 pages.
Cheah, A Proposed Architecture and Access Protocol Outline for the IEEE 802.11 Radio LAN Standards, Document IEEE P802.11191-54, May 1991, pp. 1-20.
Rypinski, Power-Drain Considerations for Full Time and Sleep Mode Radio Receivers, IEEE P802.11191-99, Sep. 1991, 11 pages.
Natarajan et al, Battery Efficient Operation of Radio MAC Protocol, IEEE P802.11191-102, Sep. 1991, pp. 1-5.
Cox, A Radio System Proposal for Widespread Low-Power Tetherless Communications, IEEE Transactions on Communications, vol. 39, No. 2 (Feb. 1991), pp. 324-335.
Bagby, One Approach to Wireless Network Architecture, IEEE P802.11191-2, Jan. 1991, 1-15, 17-21.
Biba, A Modest Proposal for a Asynchronous, Data Intensive, Wireless Local Area Network , IEEE P802.11191-25, Mar. 1991; pp. 1-25.
Heimschi et al; Merged CMOS/Bipolar Current Switch Logic (MCSL), IEEE Journal of Solid State Circuits, vol. 24, pp. 1307-1311, Oct. 1989.
Elrabaa et al; Optimization of Digital BiCMOS Circuits, An Overview, IEEE 1992, 5 pages.
Mudd et al, Very High Speed ECLICMG Gate Arrays with Submicron Structures; IEEE 1989, 5 pages.
Mizuno, et al., "A GHZ MOS Adaptive Pipeline Technique Using MOS Current-Mode Logic," IEEE Journal of Solid-State Circuits, vol. 31, No. 6, pp. 784-791, (Jun. 1996).
Yamashina, et al., "A Low-Supply Voltage GHz MOS Integrated Circuit for Mobile Computing Systems," IEEE Symposium on Low Power Electronics, pp. 8CL81, (1994), Atkinson, A Single Chip Radio Transceiver for DECT, IEEE 1997.
Mizuno, A GHzMOS Adaptive Pipeline Technique Using MOS Current-Mode Logic, IEEE Journal of SolidState Circuits, vol. 31, No. 6, pp. 784-791 (Jun. 1996).
Heimsch, Merged CMOSIBipolar Current Switch Logic (MCSL), IEEE Journal of SolidState Circuits, vol. 24, No. 5, pp. 1307-1311 (Oct. 1989).
Elrabaa, Optimization of Digital BiCMOS Circuits, An Overview, IEEE 1992.
Elrabaa, Multimitter BiCMOS CML Circuits, IEEE Journal of Solid- State Circuits, vol. 27, No. 3, pp. 454-458 (Mar. 1992).
Ewen et al., Single-Chip 1062Mbaud CMOS Transceiver for Serial Data Communication, 1995 IEEE International Solid-State Circuits Conference Digest of Technical Papers, pp. 32-33, 336.
Chen and Waldron, A Single-Chip 266Mbls CMOS TransmitterlReceiver for Serial Data Communications, 1993 IEEE International Solid-State Circuits Conference Digest of Technical Papers, pp. 100-101, 269.
Oshima et al., A Single CMOS SDH Terminal Chip for 622 Mbls STM 4C, 1994 IEEE International SolidState Circuits Conference Digest of Technical Papers, pp. 174-175.

Widmer et al., Single-Chip 4×SOOMbaud CMOS Transceiver, 1996 IEEE International SolidState Circuits Conference Digest of Technical Papers, pp. 126-127, 430.

Lee et al., A CMOS Serial Link for 1 Gbaud Fully Duplexed Data Communication, 1994 Symposium on VLSI Circuits Digest of Technical Papers, pp. 125-126.

Lee et al., A CMOS Serial Link for Fully Duplexed Data Communication, IEEE Journal of Solid-State Circuits, vol. 30, pp. 353-364 (Apr. 1995).

Djahanshahi et al., High-speed ECL-Compatible Serial I/0 in 0.35μm CMOS, IEEE 1998.

Fukaishi et al., A 4.25-Gbls CMOS Fiber Channel Transceiver with Asynchronous Tree-Type Demultiplexer and Frequency Conversion Architecture, IEEE Journal of Solid-state Circuits, vol. 33 No. 12, pp. 2139-2147 (1998).

Madhavan and Levi, Low-Power 2.5 Gbitls VCSEL driver in 0.5μm CMOS technology, Electronics Letters, vol. 34 No. 2 pp. 178-179 (Jan. 1998).

Chen and Barker, A 1.25Gb/s, 460mW CMOS Transceiver for Serial Data Communication, 1997 IEEE International Solid-state Circuits Conference pp. 242-243, 465.

Runge and Thomas, 5Gbit/s 2:1 multiplexer fabricated in 0.35μm CMOS and 3Gbit/s 1:2 demultiplexer fabricated in 0.5μm CMOS technology, Electronics Letters, vol. 35 No. 19.pp. 163 1-33 (Sep. 1999).

Fiedler et al., A 1.0625Gbps Transceiver with 2x-Oversampling and Transmit Signal Pre-Emphasis, 1997 IEEE International Solid- state Circuits Conference pp. 238-239,464.

Widmer et al., Single-Chip 4×50CLMEd CMOS Transceiver, IEEE Journal of Solid-state Circuits, vol. 31 No. 12 pp. 2004-2014 (1996).

Kurisu et al., 2.8Gb/s 176mW Byte-Interleaved and 3.0 Gbls 118mW Bit-Interleaved 8:1 Multiplexers, 1996 International Solid state Circuits Conference pp. 122-123, 429.

Friedman et al, A Baseband Processor for IS-54 Cellular Telephony, IEEE Journal of Solid-state Circuits, vol. 31 No. 5 pp. 646-655 (May 1996).

Ewen et al., CMOS circuits for Gbls serial data communication, IBM J. Res. Develop., vol. 39 No. 12 pp. 73-81 (Mar. 1995).

Thompson et al., A 300-MHz BiCMOS Serial Data Transceiver, IEEE Journal of Solid-state Circuits, vol. 29 No. 3 pp. 185-192 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbitls Bandwidth MultiplexerfDemultiplexer CMOS Chip, 1992 Symposium on VLSI Circuits Digest of Technical Papers pp. 68-69.

Navarro and Van Noije, Design of an 8:I MUX at 1.7Gbit/s in 0.8μm CMOS Technology, 1998 Great Lakes Symposium on VLSI.

Pederson and Metz, A CMOS to lOOK ECL Interface Circuit, 1989 IEEE International Solid-State Circuits Conference pp. 226-227, 345.

Baumert et al., A Monolithic 50-200 MHz CMOS Clock Recovery and Retiming Circuit, IEEE 1989 Custom Integrated Circuits Conference pp. 14.5.1-14.5.4, (May 1989).

Atkinson, A Single Chip Radio Transceiver for DECT, IEEE 1997.

Klose, Process-Optimization for Sub-30ps BiCMOS Technologies for Mixed ECLICMOS Applications, IEEE 1991.

Leung D L C et al: "A 3-V CMOS differential bandpass amplifier for GSM receivers" Circuits and Systems, 1998. ISCAS '98. Proceedings of the 1998 IEEE International Symposium on Monterey, CA, USA May 31-Jun. 3, 1998. New York, NY, USA, IEEE, US, May 31, 1998. pp. 341-344, XPO10289447 ISBN: 0-7803-4455-3 figure 5.

Qiang Li et al Institute of Electrical and Electronics Engineers: RF circuit performance degradation due to soft breakdown and hot carrier effect in 0.19 isp mu/m CMOS technology 2001 IEEE Radio Frequency Integrated Circuits (RFIC). Symposium Digest of Papers. Phoenix, AZ, May 20-22, 2001. IEEE Radio Frequency Integrated Circuits Symposium, New York, NY: IEEE, US, May 20, 2001, pp. 139-142, XP010551339 ISBN: 0-7803-6601-8 figure 3.

Razavi B Ed-Institute of Electrical and Electronics Engineers; "Prospects Of CMOS Technology For High-Speed Optical Communication Circuits" GaAs IC symposium, 23rd Annual IEEE Gallium Arsenide Integrated Circuit Symposium. Technical digest 2001. Baltimore, MD, Oct. 21-24, 2001, GaAs IC Symposium-IEEE Gallium Arsenide Integrated Circuit Symposium, New York, NY IEEE, US, Oct. 21, 2001, pp. 3-6, XP001O46946 ISBN: 0-7803-6663-8 figures 6a,7.

Li Q et al: "RF Circuit Performance Degradation Due to Soft Breakdown and Hot-Carrier Effect in Deep-Submicrometer CMOS Technology" IEEE Transactions on Microwave Theory and Techniques, IEEE Inc. New York, US, vol. 49, No. 9, Sep. 2001, pp. 1546-1551, XP001099604 ISSN: 0018-9480 figure 9.

Shuichi Fujita, Yuhki Imai, Yasuro Yamane, and Hiroshi Fushimi: "DC to 10-GHz Mixer and Amplifier GaAs IC's for Coherent Optical Heterodyne Receiver," IEEE Journal of Solid-State Circuits, IEEE Service Center, Piscataway, NJ, US, vol. 26, No. 12, Dec. 1991, pp. 1847-1851.

David L. C. Leung and Howard C. Luong: "A 3-V CMOS Differential Bandpass Amplifier For GSM Receivers," Circuits and Systems, 1998. ISCAS '98, Proceedings Of The 1998 IEEE International Symposium on Monterey, CA, USA 31, May 3-Jun. 1998, New York, NY, USA, IEEE, US, vol. 4, May 31, 1998, pp. 341-344.

* cited by examiner

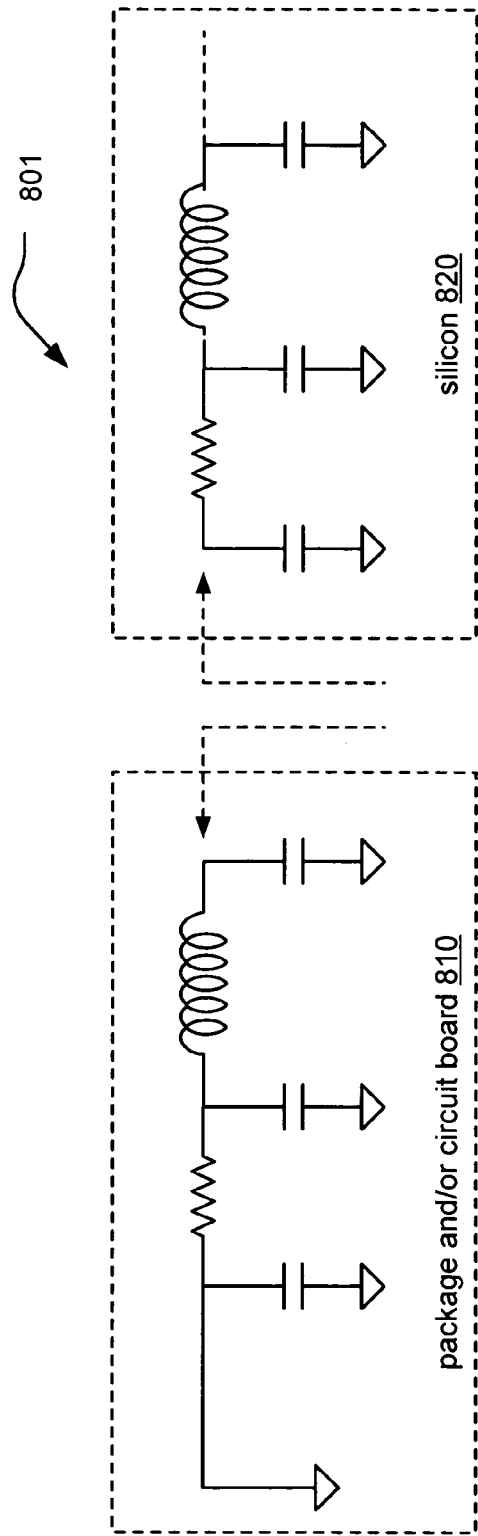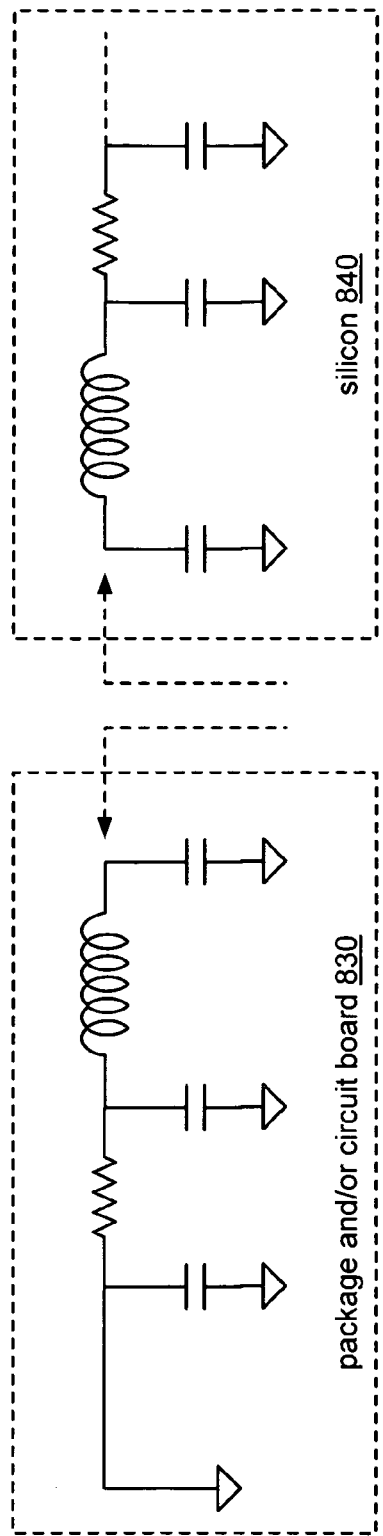
Fig. 8A
Fig. 8B

CURRENT-CONTROLLED CMOS (C3MOS) WIDEBAND INPUT DATA AMPLIFIER FOR REDUCED DIFFERENTIAL AND COMMON-MODE REFLECTION

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 60/703,908, entitled "Current-controlled CMOS (C3MOS) wideband input data amplifier for reduced differential and common-mode reflection," filed Friday, Jul. 29, 2005 (07/29/2005), now abandoned.

Incorporation by Reference

The following U.S. Utility patent applications are hereby incorporated herein by reference in their entirety and made part of the present U.S. Utility patent application for all purposes:

1. U.S. Utility patent application Ser. No. 09/484,856, entitled "Current-controlled CMOS logic family," filed Jan. 18, 2000 (01/18/2000), now U.S. Pat. No. 6,424,194 B1, issued Jul. 23, 2002 (07/23/2002).

2. U.S. Utility patent application Ser. No. 09/610,905, entitled "Current-controlled CMOS circuits with inductive broadbanding," filed Jul. 6, 2000 (07/06/2000), now U.S. Pat. No. 6,340,899 B1, issued Jan. 22, 2002 (01/22/2002).

3. U.S. Utility patent application Ser. No. 10/028,806, entitled "Current-controlled CMOS wideband data amplifier circuits," filed Oct. 25, 2001 (10/25/2001), now U.S. Pat. No. 6,624,699 B2, issued Sep. 23, 2003 (09/23/2003).

BACKGROUND OF THE INVENTION

1. Technical Field of the Invention

The invention relates generally to the communication devices; and, more particularly, it relates to the field of amplification that may be implemented within such communication devices.

2. Description of Related Art

High speed wideband data amplifiers are used in wideband data communication applications. For a number of reasons including speed limitations of process technology, power consumption and other cost related concerns, it is desirable to develop efficient techniques to boost the amplifier bandwidth for higher frequency operations. High speed circuit techniques such as current-controlled CMOS (or C3MOS) logic have been developed that have brought about marked increase in the speed of circuitry fabricated using standard CMOS process technology.

Moreover, when implementing such circuitry onto silicon substrates and into packages (e.g., within integrated circuits), there is oftentimes a difficulty in the interfacing that is performed between the initial circuitry within an integrated circuit and the bond wires, traces, and/or pads to which this initial circuitry within the integrated circuit communicatively couples. This interface may generally be referred to as the interface between a silicon chip and a package and/or circuit board. Generally speaking, there is oftentimes a difficulty in the impedance matching at this critical interface. In doing this interfacing stripline and microstrip transmission lines may be employed.

Stripline and microstrip transmission lines are transverse electromagnetic (TEM) and quasi-TEM structures, respectively. Ideally, waves that propagate on these structures have propagation constants that are predominantly linear with frequency and hence phase velocities that are nearly constant with frequency. In isolation, these lines exhibit a single-ended characteristic impedance, phase velocity and attenuation. For instance, if a transmission line with 50Ω characteristic impedance is terminated with a 50Ω load, there will be no reflection at the interface between the transmission line and the load.

However, in real life applications, several non-linearities create impedance mismatch at the interface between the silicon chip and package and/or circuit board, which may cause significant reflection and thus degrade the signal integrity. Firstly, as a pair of these striplines and microstrip transmission lines is moved closer together, for example, at the package substrate, coupling occurs that significantly alters the transmission parameters and makes possible the propagation of differential and common-mode guided waves. To preserve signal integrity, both differential and common-mode reflection needs to be minimized. Secondly, the bonding wire connecting package to silicon die usually exhibit inductive impedance at multi-GHz (Giga-Hertz) data rates. Thirdly, the capacitive loading to the signal path from bonding pad and ESD (Electrostatic Sensitive Device) structure at the silicon die becomes more and more significant as the data rate increases, even if termination resistors are placed very close to the input pads. Furthermore, the capacitive loading from the transistors at the input of the data amplifier creates shorts in parallel with the termination resistor and reduces the overall impedance at higher frequency, which results in reduced bandwidth of the input data amplifier and increased reflection at input. In a single-ended configuration represented by lumped elements, the mismatch at the interface of silicon 120 and package and/or circuit board 110 can be shown in FIG. 1.

FIG. 1 illustrates a prior art embodiment of impedance mismatch 100 at the interface of silicon 120 and package and/or circuit board 110.

At the interface, looking towards the package and/or circuit board side 110, the impedance is predominantly inductive. In contrast, looking towards the silicon side 120, the impedance is predominantly capacitive. This is true for both differential mode and single-mode transmission.

There continually exists in the art a need for amplifier stages having a frequency response that gives sufficient gain at the higher frequency ranges while also minimizing the power consumption of the amplifier, and for eliminating expensive process requirements.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 8A illustrates an embodiment of impedance matching at the interface of silicon and a package and/or circuit board in a single-ended configuration as represented by lumped elements corresponding to the C3MOS wideband data amplifier circuit of the FIG. 2.

FIG. 8B illustrates an embodiment of impedance matching at the interface of silicon and a package and/or circuit board in a single-ended configuration as represented by lumped elements corresponding to a C3MOS wideband input data amplifier circuit that has been constructed.

DETAILED DESCRIPTION OF THE INVENTION

Figure 1:
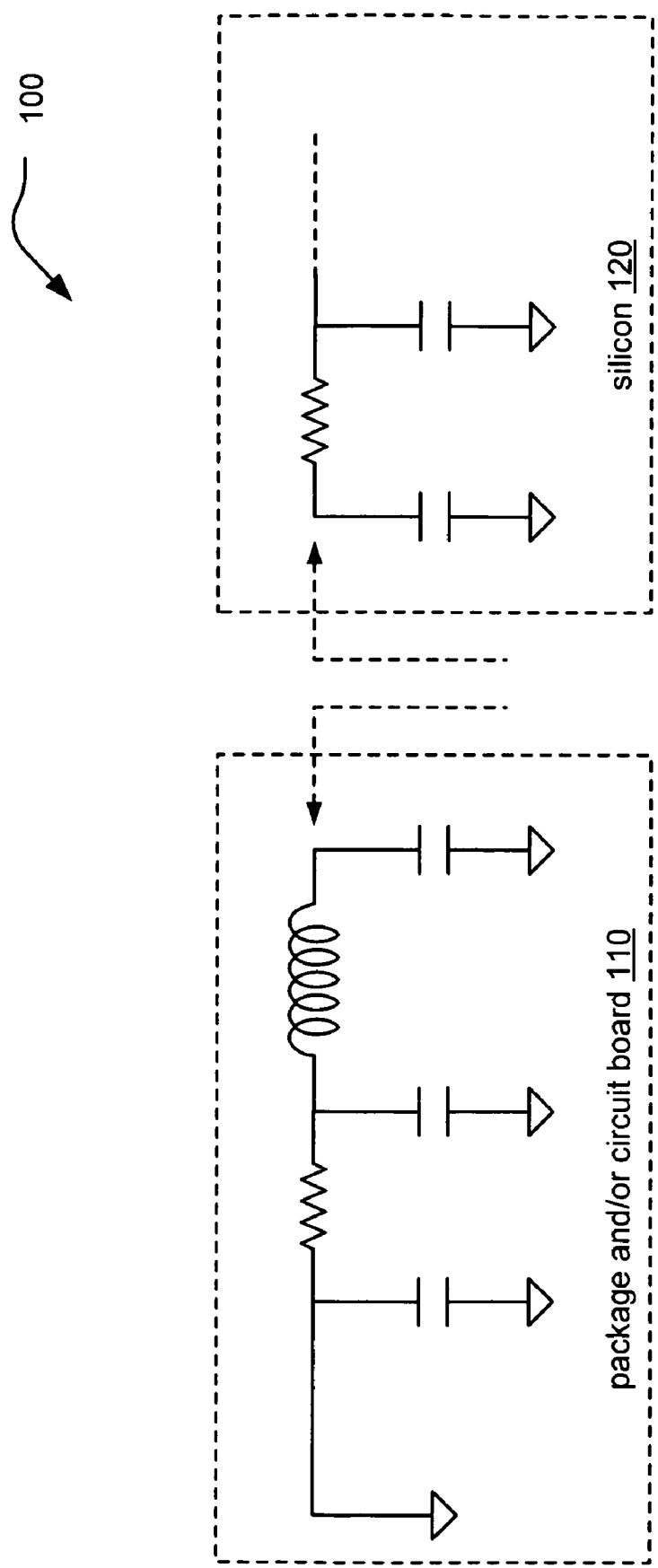
FIG. 1 illustrates a prior art embodiment of impedance mismatch at the interface of silicon and package and/or circuit board.

The embodiments of the invention provide for ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. Embodiments of the invention uses current-controlled mechanisms to develop a family of very fast current-controlled CMOS (C3MOS or C³MOS™) logic that can be fabricated using a variety of conventional CMOS process technologies, but that unlike conventional CMOS logic does dissipate static current. C3MOS logic or current-controlled metal-oxide-semiconductor field-effect transistor (MOSFET) logic are used herein interchangeably.

Various C3MOS circuit techniques are described in greater detail in commonly-assigned U.S. patent application Ser. No. 09/484,856, now U.S. Pat. No. 6,424,194 B1, entitled "Current Controlled CMOS Logic Family," by A. Hairapetian, which is hereby incorporated by reference in its entirety for all purposes as indicated above.

Other techniques have been developed to increase the gain-bandwidth product of CMOS circuitry. For example, shunt peaking is one approach that has resulted in improved gain-bandwidth product. Shunt peaking involves putting an inductor in series with the output resistor to expand the bandwidth of the circuit. Such inductive broadbanding technique combined with C3MOS circuitry has been described in greater detail in commonly-assigned U.S. patent application Ser. No. 09/610,905, now U.S. Pat. No. 6,340,899 B1, entitled "Current-Controlled CMOS Circuits with Inductive Broadbanding," by M. Green, which is hereby incorporated by reference in its entirety for all purposes as indicated above.

The expansion of the gain-bandwidth product brought about by such inductive peaking, however, is limited to about 1.5 times, and the inductors needed are generally large which requires a large area on an integrated circuit. In wideband data communications, the usable data frequency range starts at several kHz (kilo-Hertz) and extends all the way up to many GHz (Giga-Hertz). A wideband amplifier is required to handle such a broad spectrum of data frequencies. This is in contrast to the wireless domain where communications occurs only over a narrow band, which can be accomplished using a tuned amplifier with an inductor and a capacitor. However, a relatively constant or flat frequency response is desired over a wide frequency band in a wideband data amplifier.

Typically, in designing a wideband amplifier there is a trade off between gain and bandwidth. The product of gain and bandwidth is usually a constant for the same topology. However, by using special techniques, bandwidth can be extended while maintaining the same gain level. One conventional way is to employ a faster process technology, such as GaAs or InP when fabricating integrated circuits upon which the wideband data amplifier is implemented. However, these technologies are generally more costly and not as widely available as standard CMOS process.

In commonly-assigned U.S. patent application Ser. No. 10/028,806, now U.S. Pat. No. 6,624,699 B2, entitled "Current-controlled CMOS wideband data amplifier circuits," by Guangming Yin and Jun Cao, a pair of series inductors (L1 and L2) is connected to the gates of the input transistors as shown in FIG. 2, together with the input pads 201 and 202, and the 50Ω termination loads.

Figure 2:
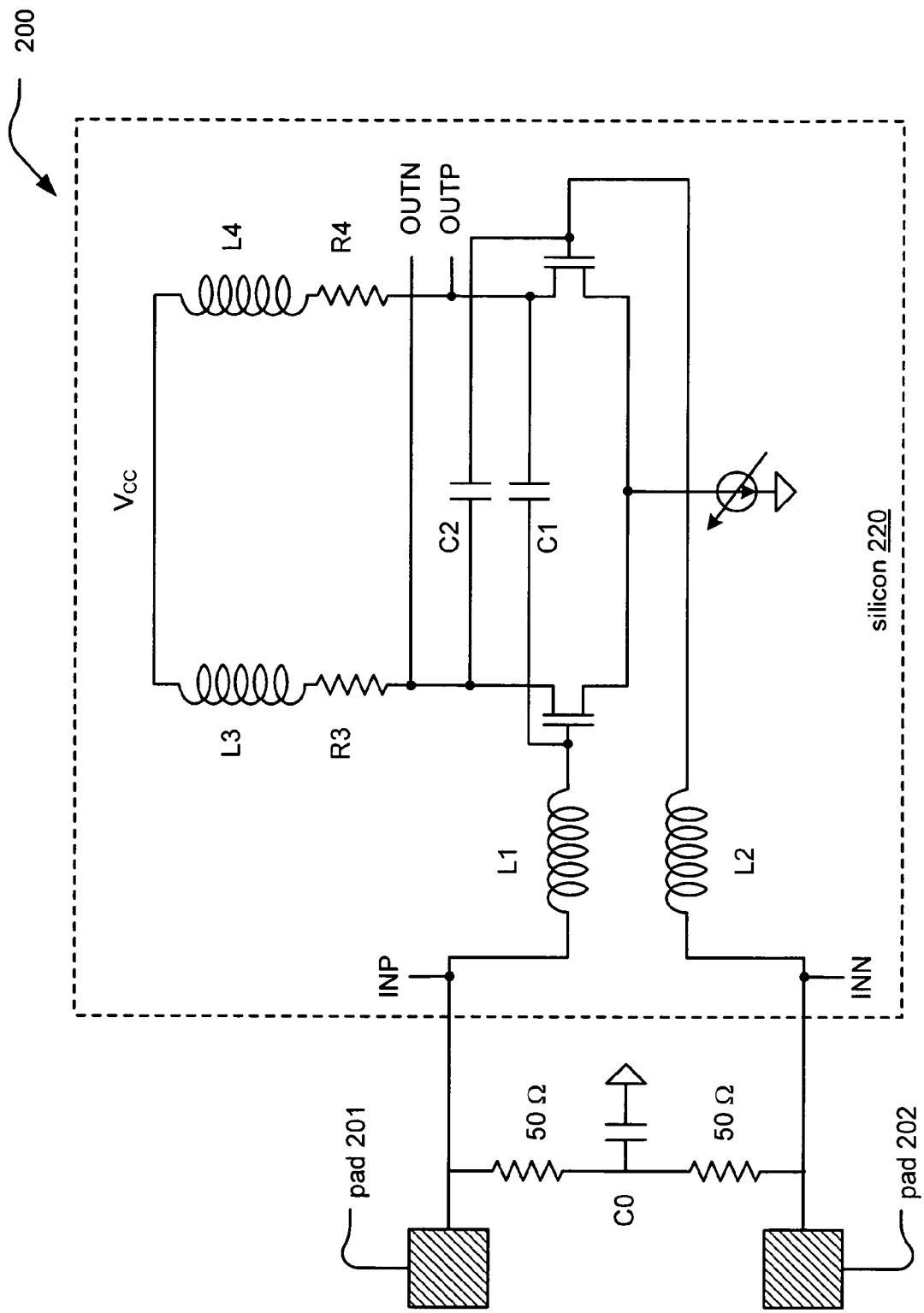
FIG. 2 illustrates an embodiment of a current-controlled CMOS (C3MOS) wideband data amplifier circuit.

FIG. 2 illustrates an embodiment of a current-controlled CMOS (C3MOS) wideband data amplifier circuit 200.

The input series inductors (L1 and L2) resonate with the capacitance at the input of the differential pair at high frequencies and thus extend the bandwidth of the amplifier. In addition, at high frequencies, the inductors (L1 and L2) act as high impedance chokes between the termination resistors (shown as two series connected 50 Ω resistors) and the capacitors and thus also improve the input reflection of the chip. The entirety of input series inductors (L1 and L2), the differential pair coupled to the current source, the capacitors (C1 and C2), the series load connected resistors and inductors (R3 and L3 as well as R4 and L4) can all be implemented within a single package of silicon 220.

If desired, a low impedance path can be provided to create an AC ground for improved common mode reflection. A relatively large capacitor (C0) can be connected between the shared node of the termination resistors (i.e., the two series connected 50Ω resistors) and ground.

Figure 3:
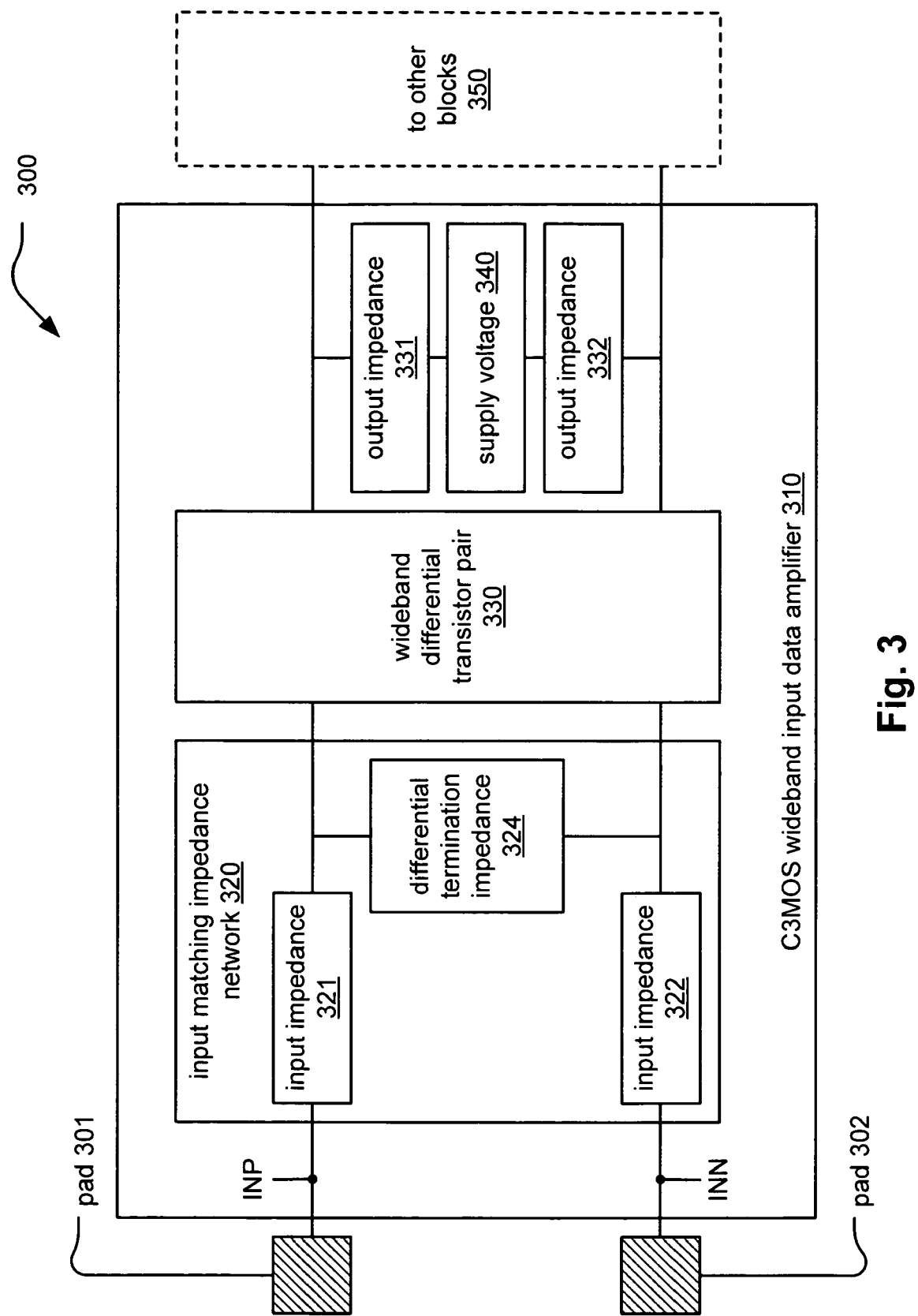
FIG. 3 illustrates an embodiment of a C3MOS wideband input data amplifier circuit that provides for expanded bandwidth and reduced reflection at the interface of silicon and package and/or circuit board.

FIG. 3 illustrates an embodiment 300 of a C3MOS wideband input data amplifier circuit 310 that provides for expanded bandwidth and reduced reflection at the interface of silicon and package and/or circuit board.

A novel approach is presented by which better impedance matching may be achieved between the package and/or circuit board side and the silicon side. Given the fact that many newer designs are seeking to employ smaller traces and components in an effort to reduce size and power consumption, significant reflections may occur at this interface when poor impedance matching (or no impedance matching at all) is performed.

The C3MOS wideband input data amplifier circuit 310 is a first input stage at the interface of package and/or circuit board on one side and silicon on the other side. Two differential input pads (shown as 301 and 302) communicatively couple to the C3MOS wideband input data amplifier circuit 310 providing a differential input signal (shown as INP and INN). An input matching impedance network 320 is emplaced between the input to the C3MOS wideband input data amplifier circuit 310 and a wideband differential transistor pair 330. Generally speaking, the input matching impedance network 320 includes two separate input impedances (shown as 321 and 322) that are coupled serially in the two respective paths of the differential input signal and a differential termination impedance 324 that communicatively couples between the two respective paths of the differential input signal. The differential termination impedance 324 is located after each of the input impedances 321 and 322. The differential output signal of the input matching impedance network 320 is the input to the wideband differential transistor pair 330.

Two separate output impedances (shown as 331 and 332) couple between the wideband differential transistor pair 330 and a supply voltage 340 within the C3MOS wideband input data amplifier circuit 310. The supply voltage 340 may simply be a node within the C3MOS wideband input data amplifier circuit 310 that receives a power supply's voltage and brings it into the C3MOS wideband input data amplifier circuit 310. The differential output signal of the wideband differential transistor pair 330 (which is also the differential output signal of the C3MOS wideband input data amplifier circuit 310) then communicatively couples to one or more other blocks 350 within the same integrated circuit or via appropriate integrated circuit connections to one or more other integrated circuits, circuit boards, blocks and/or devices.

A designer is provided a great deal of latitude in selecting the individual components of the input matching impedance network 320 in an effort to match the impedance of the package and/or circuit board; this is also true with respect to the individual sub-components of the input matching impedance network 320 (i.e., the input impedances 321 and 322 and the differential termination impedance 324). Analogously, a designer is provided a great deal of latitude in selecting the individual components of the output impedances 331 and 332. Some possible embodiments by which these various blocks may be implemented are presented below.

For example, it is noted that the C3MOS wideband input data amplifier circuit 310 may also be further improved by replacing the input impedances 321 and 322 (e.g., that may typically be primarily inductive in many embodiments) with an inductive network that includes (multiple) inductor(s), resistor(s) and capacitor(s). The design focus idea is to use more elements (i.e., the appropriate number and combination of elements) to match the impedance looking towards board and/or package more precisely within a broader frequency range and at the same time to create a resonant circuit to generate peaking at high frequency so that the bandwidth of the circuit can be extended. In this case, the overall series resistance in the input impedances 321 and 322 of the matching impedance network 320 (e.g., which may be largely inductive in many instances) needs to be small in order to still have a good impedance matching at the low frequencies and to be able to create effective peaking to extend the bandwidth.

Figure 4:
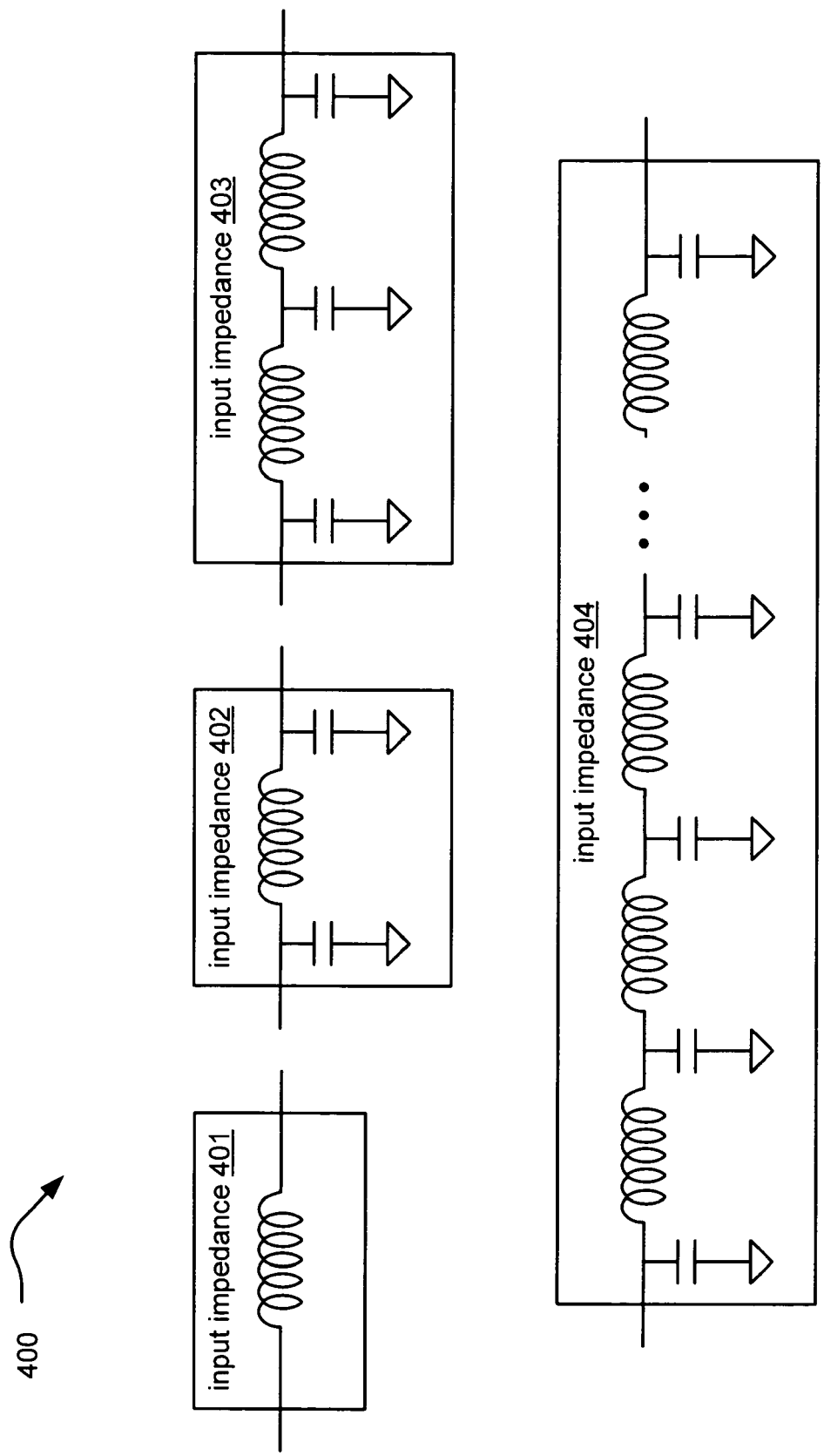
FIG. 4 illustrates various embodiments of input impedance that may be employed within a C3MOS wideband input data amplifier circuit that has been constructed.

FIG. 4 illustrates various embodiments 400 of input impedance that may be employed within a C3MOS wideband input data amplifier circuit that has been constructed. As mentioned above, the input impedances 321 and 322 of the FIG. 3 may be designed in a variety of ways. Input impedance 401 includes simply a series connected inductor. Input impedance 402 includes a series connected inductor with two separate shunt capacitors location at the two ends of the series connected inductor. Input impedance 403 includes two series connected inductors with three separate shunt capacitors location at the nodes generated by the two series connected inductors. Generally speaking, any number of selected series connected inductors and shunt capacitors may be selected as shown by the input impedance 404 that includes a plurality of series connected inductor with a plurality of shunt capacitors location at the various nodes generated by the plurality of series connected inductors. In most instances, to match the impedance looking towards the package and/or circuit board side and looking towards the silicon side, it is advantageous to make the input more inductive.

Figure 5:
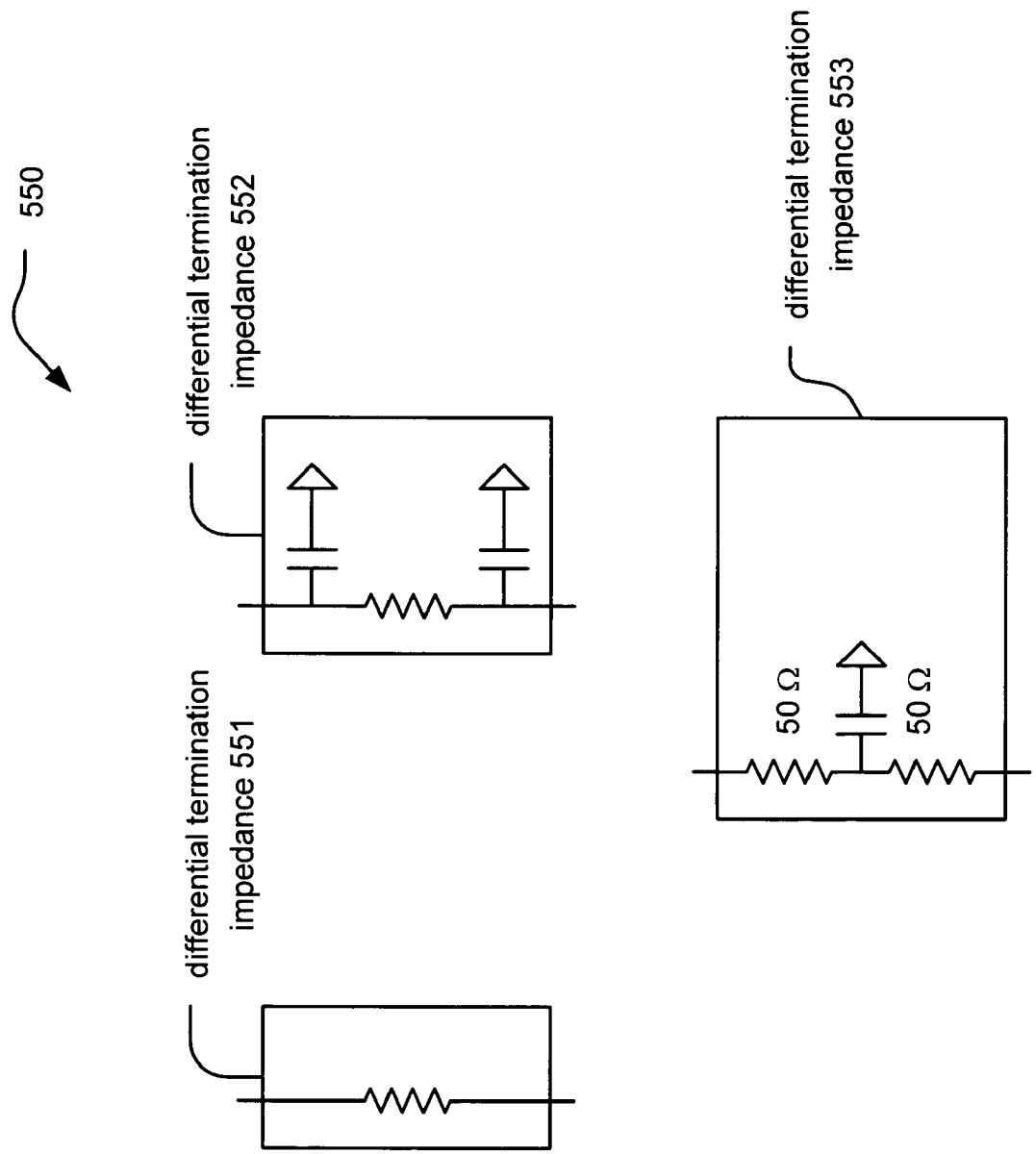
FIG. 5 illustrates various embodiments of differential termination impedance that may be employed within a C3MOS wideband input data amplifier circuit that has been constructed.

FIG. 5 illustrates various embodiments 550 of differential termination impedance that may be employed within a C3MOS wideband input data amplifier circuit that has been constructed. As mentioned above, the differential termination impedance 324 of the FIG. 3 may be designed in a variety of ways. Differential termination impedance 551 includes simply a series connected resistor. Differential termination impedance 552 includes a series connected resistor with two separate shunt capacitors location at the two ends of the series connected resistor.

Differential termination impedance 553 includes two 50Ω series connected resistors; these particular values (e.g., 50Ω) may be selected in an effort to mach the characteristic impedance of the pads and associated bond wire interfacing of the package and/or circuit board side. In addition, as mentioned above with respect to another embodiment, a low impedance path can be provided to create an AC ground for improved common mode reflection. A relatively large capacitor, or other appropriately selected low impedance component combination, can be connected between the shared node of the two 50Ω series connected resistors and ground.

Figure 6:
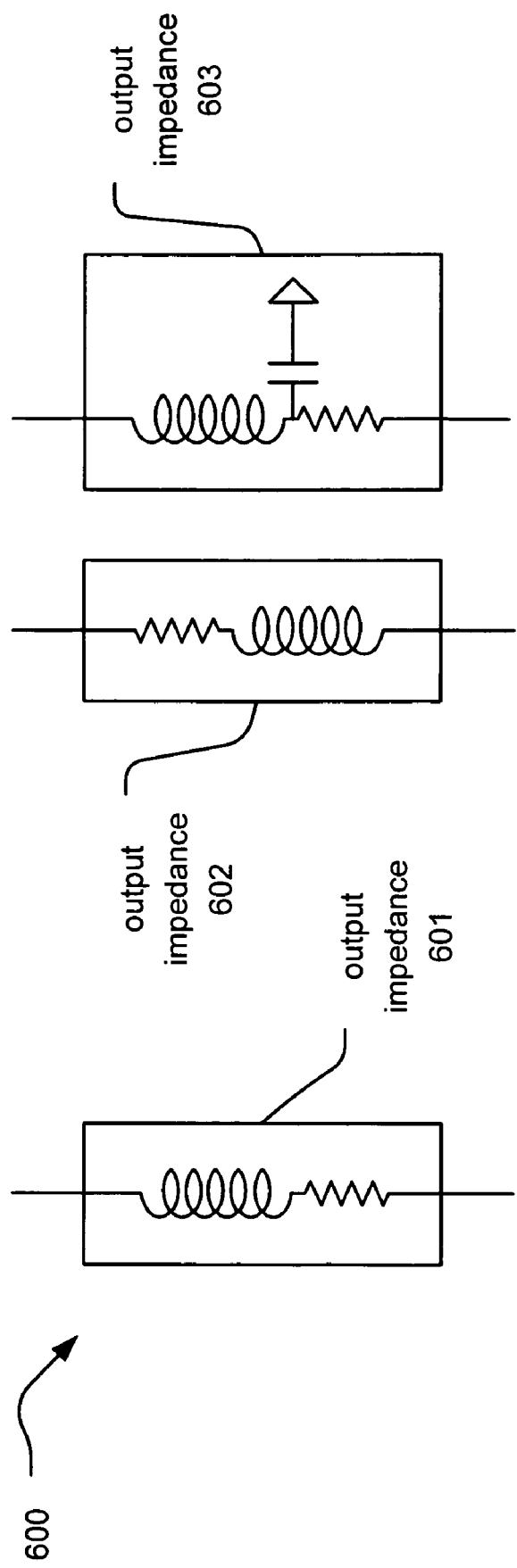
FIG. 6 illustrates various embodiments of output impedance that may be employed within a C3MOS wideband input data amplifier circuit that has been constructed.

FIG. 6 illustrates various embodiments 600 of output impedance that may be employed within a C3MOS wideband input data amplifier circuit that has been constructed. As mentioned above, the output impedances 331 and 332 of the FIG. 3 may be designed in a variety of ways. Output impedance 601 includes a series connected resistor and inductor in one order, and output impedance 602 also includes a series connected resistor and inductor but in a reverse order. Output impedance 603 includes a series connected resistor and inductor the same order as the output impedance 601 while also include a shunt capacitor connected to the node generated at the connection of the series connected resistor and inductor.

For each of these embodiments depicted within the FIG. 4, FIG. 5, and FIG. 6, it is noted that these possible embodiments are not exhaustive but merely illustrative of the wide variety and latitude that a designer is provided to ensure that appropriate impedance matching can be performed at the interface between silicon on one side and the package and/or circuit board on the other side.

Figure 7:
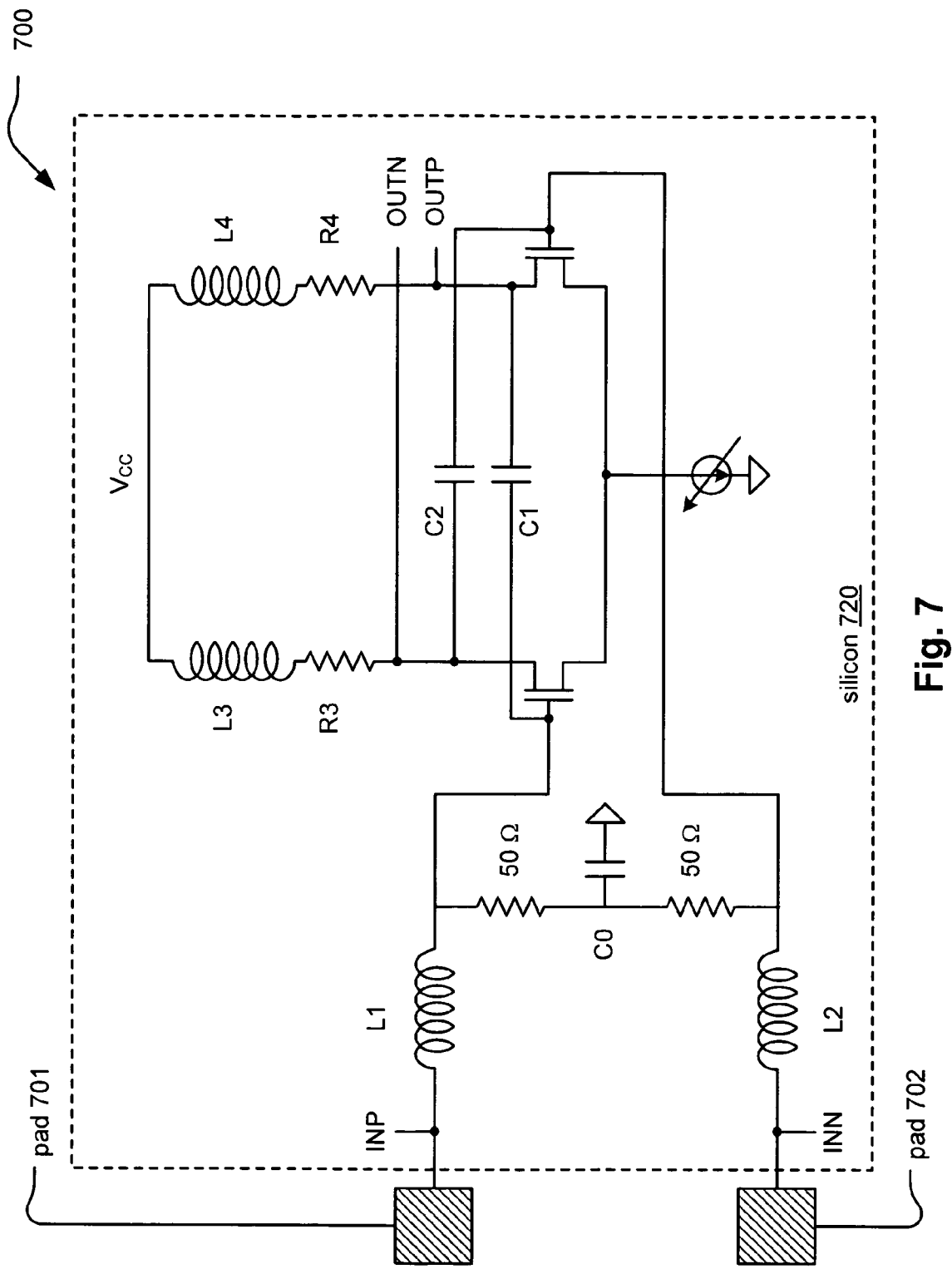
FIG. 7 illustrates another embodiment of a C3MOS wideband input data amplifier circuit that provides for expanded bandwidth and reduced reflection at the interface of silicon and package and/or circuit board.

FIG. 7 illustrates another embodiment 700 of a C3MOS wideband input data amplifier circuit that provides for expanded bandwidth and reduced reflection at the interface of silicon and package and/or circuit board.

A current source transistor may be biased by a bias voltage so that a constant current flows from drain to source in the current source transistor. Two separate differential transistors compose a wideband differential transistor pair. A first differential transistor has its gate tied to the negative end of a first series peaking inductor L1, while a positive differential input signal INP is coupled to the positive end of the first series peaking inductor L1. Similarly, a second differential transistor has its gate tied to the negative end of a second series peaking inductor L2, while a negative differential input signal INN is coupled to the positive end of the second series peaking inductor L2. In addition, two series connected 50Ω termination resistors are connected between the gates of the first differential transistor and the second first differential transistor.

As also provided above within other embodiments, a low impedance path can be provided to create an AC ground for improved common mode reflection. A relatively large capacitor (C0) can be connected between the shared node of the termination resistors (i.e., the two series connected 50Ω resistors) and ground.

Assuming that the first and second differential transistors are identical, then the first and second series peaking inductors L1 and L2 have the same inductance. A first output resistor R3 has its negative end tied to the drain of the first differential transistor, and has its positive end tied to the negative end of a first shunt peaking inductor L3. A second output resistor R4 has its negative end tied to the drain of the second differential transistor, and has its positive end tied to the negative end of a second shunt peaking inductor L4. The positive ends of the first and second shunt peaking inductors L3 and L4 are tied to the positive supply voltage (shown as $V_{CC}$). Preferably, the first and second output resistors R3 and R4 have the same resistance value R, and the first and second shunt peaking inductors L3 and L4 have the same inductances. A first capacitor C1 (which may be referred to as a first Miller cancellation capacitor C1) has its positive end coupled to the drain of the second differential transistor, and has its negative end coupled to the gate of the first differential transistor. A second capacitor C2 (which may be referred to as a second Miller cancellation capacitor C2) has its positive end coupled to the drain of the first differential transistor, and has its negative end coupled to the gate of the second differential transistor. A first output signal OUTP is taken at the drain of the second differential transistor, and the second output signal OUTN is taken at the drain of the first differential transistor.

The entirety of input series inductors (L1 and L2), the two 50Ω resistors, the capacitor (C0), the differential pair coupled to the current source, the capacitors (C1 and C2), the series load connected resistors and inductors (R3 and L3 as well as R4 and L4) can all be implemented within a single package of silicon 720.

Referring back to FIG. 1, to match the impedance looking towards the package and circuit board side 100 and looking towards the silicon 120, it is advantageous to make the input more inductive. Nevertheless, one would still like to utilize the bandwidth expansion created by gate-connected inductors (L1 and L2). As a result, a new wideband data amplifier at the input of the chip can be designed as depicted in FIG. 7, together with the input pads (shown as 701 and 702) and two series connected 50Ω termination resistors (connected between the differential input signals which connect to the gates of the first differential transistor and the second differential transistor within the wideband differential transistor pair). In the new design, the input inductors (L1 and L2) still resonate with the capacitors associated with the inputs and create peaking at high frequency in the frequency response. This helps to extend the bandwidth of the data amplifier. On the other hand, the input inductors also make the input impedance more inductive and thus matching better with the package and/or circuit board. This will help to reduce the reflection at the interface between the silicon and package and/or circuit board.

FIG. 8A illustrates an embodiment 801 of impedance matching at the interface of silicon 820 and a package and/or circuit board 810 in a single-ended configuration as represented by lumped elements corresponding to the C3MOS wideband data amplifier circuit of the FIG. 2.

FIG. 8B illustrates an embodiment 802 of impedance matching at the interface of silicon 830 and a package and/or circuit board 840 in a single-ended configuration as represented by lumped elements corresponding to a C3MOS wideband input data amplifier circuit that has been constructed.

The advantage of the novel design being presented herein is further illustrated when comparing FIG. 8A and FIG. 8B. The FIG. 8A corresponds to the C3MOS wideband data amplifier circuit of the FIG. 2, and the FIG. 8B corresponds to a C3MOS wideband data amplifier circuit having better matched impedance as being designed. The impedance matching at the interface of silicon and package and/or circuit board in these diagrams is represented in a single-ended configuration represented by lumped elements for the circuits.

When comparing FIG. 8A and the FIG. 8B, it is evident that a circuit, designed in accordance with an embodiment of the invention, provides a much better impedance matching in the single-ended configuration which is applicable to common-mode reflections.

Figure 9:
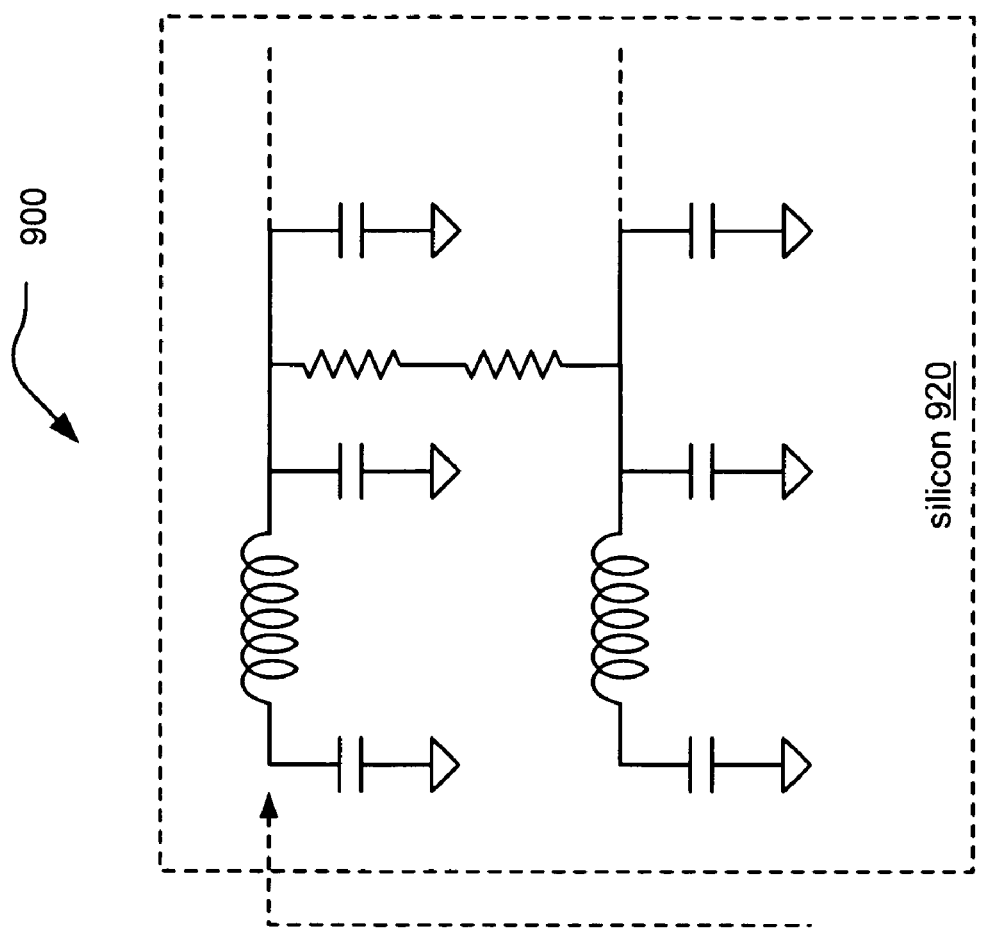
FIG. 9 illustrates an embodiment of impedance matching at the interface of silicon and a package and/or circuit board in a differential mode configuration as represented by lumped elements corresponding to a C3MOS wideband input data amplifier circuit that has been constructed.
Figure 9:
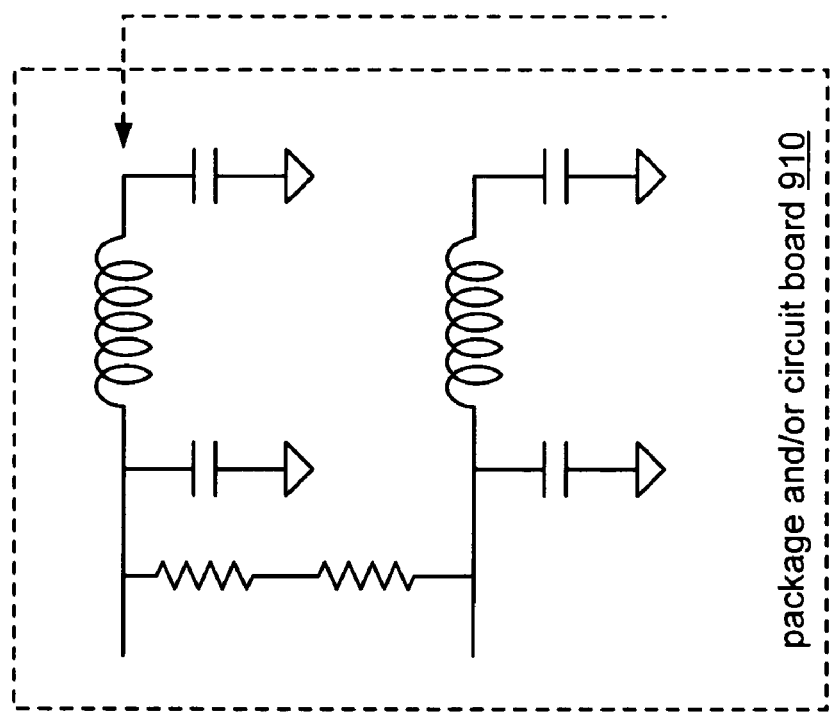

For the differential mode, a circuit, designed in accordance with an embodiment of the invention, also reduces the input reflection by matching the impedance looking towards the silicon to the impedance looking towards the board/package, as shown in FIG. 9.

In order not to degrade the reflection at very low frequencies, the input impedances (e.g., that may includes 1 or more series connected inductors) should have relatively low series parasitic resistance. In other words, any inductors employed therein should have a quality factor that is reasonably high. This would also help to extend the bandwidth more effectively because if the quality factor is too low, the resonant peak in the frequency response of the C3MOS wideband input data amplifier circuit will be too small to impact on the overall bandwidth.

FIG. 9 illustrates an embodiment 900 of impedance matching at the interface of silicon 920 and a package and/or circuit board 910 in a differential mode configuration as represented by lumped elements corresponding to a C3MOS wideband input data amplifier circuit that has been constructed.

Figure 10:
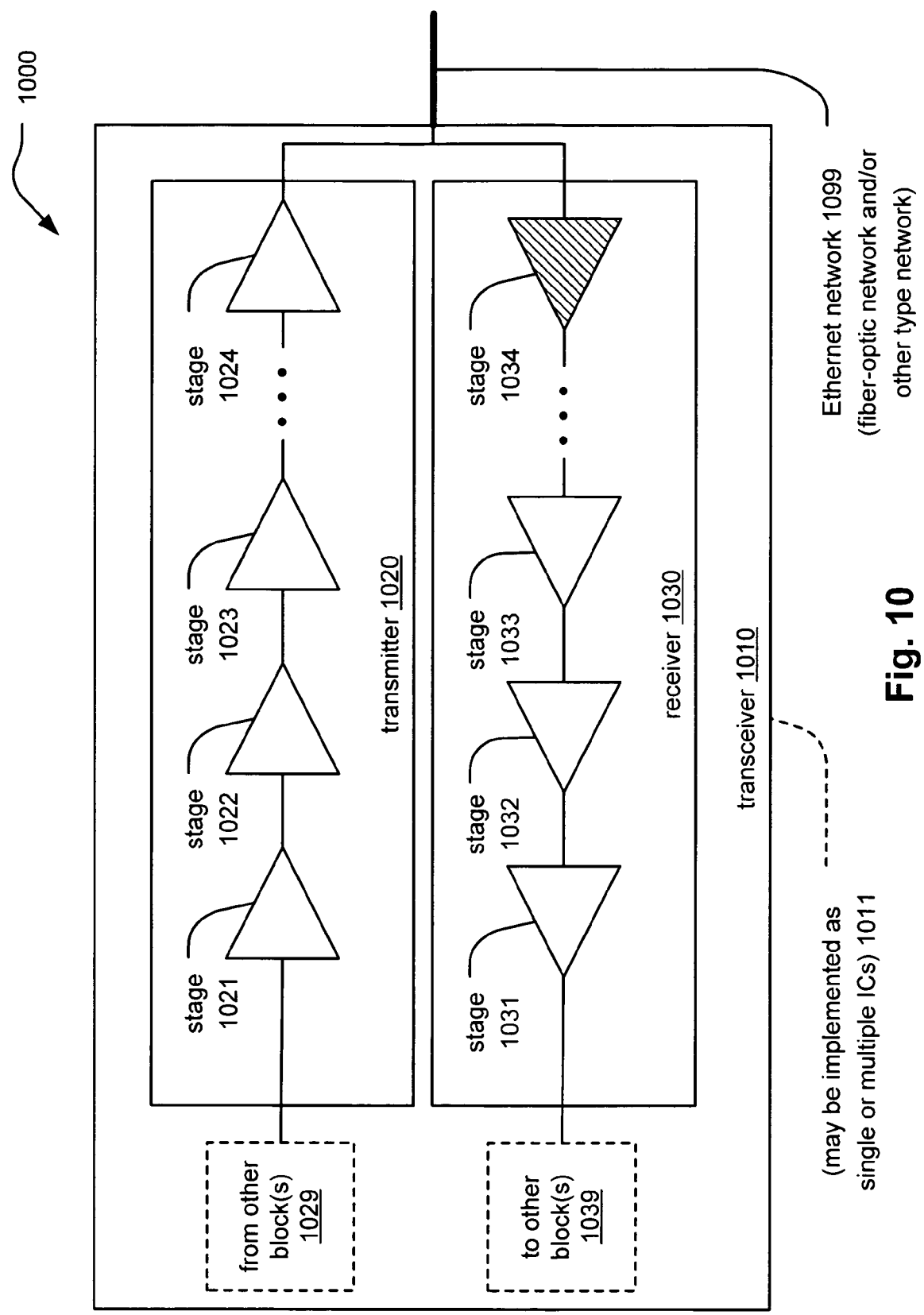
FIG. 10 illustrates an embodiment of implementation of one or more C3MOS wideband input data amplifier circuits within a communication transceiver that communicatively couples to a communication network.

FIG. 10 illustrates an embodiment 1000 of implementation of one or more C3MOS wideband input data amplifier circuits within a communication transceiver that communicatively couples to a communication network.

This diagram shows a communication transceiver 1010 that may be implemented in any of a wide variety of communication systems. For example, the communication transceiver 1010 may communicatively couple to and communicate with an Ethernet network 1099. Such an Ethernet network 1099 may be implemented as a fiber-optic network; generally speaking, the Ethernet network 1099 may also be implemented as a wired network or a combination network that includes both wired and wireless components. As desired, the communication transceiver 1010 may be implemented to perform bi-directional communication with a wide variety of communication system types. In addition, the communication transceiver 1010 may be implemented as a single integrated circuit in some embodiments. Alternatively, various components of the communication transceiver 1010 and the functional blocks included therein may also be implemented using individual integrated circuits, and these integrated circuits may be integrated together to form a larger module or device that composes the communication transceiver 1010.

Looking at the bi-directional capability of the communication transceiver 1010, it can be seen that there is an upstream and a downstream flow. Looking from another perspective, there in an input flow to the communication transceiver 1010, and there is an output flow from the communication transceiver 1010. The input flow within the communication transceiver 1010 may come from 1 or more other blocks (shown as reference numeral 1029) within or outside of the communication transceiver 1010; this flow passes to a transmitter 1020. This transmitter 1020 may be simply a functional block within the communication transceiver 1010 (i.e., when the communication transceiver 1010 is implemented as a singular integrated circuit). Alternatively, this transmitter 1020 may itself be a distinct integrated circuit that is part of a number of integrated circuits that compose the communication transceiver 1010. Analogously, the input flow to the communication transceiver 1010 comes from the very network to which the communication transceiver 1010 communicatively couples and with which the communication transceiver communicates (e.g., input flow from the Ethernet network 1099). This input flow to the communication transceiver 1010 (e.g., from the Ethernet network 1099) may then be viewed as an outflow within the communication transmitter (e.g., outflow from the receiver 1030 yet still within the transceiver 1010) as it passes to 1 or more other blocks (shown as reference numeral 1039) within or outside of the communication transceiver 1010 after having passed through the initial processing component of a receiver 1030. As with the transmitter 1020, this receiver 1030 may be simply a functional block within the communication transceiver 1010 (i.e., when the communication transceiver 1010 is implemented as a singular integrated circuit). Alternatively, this receiver 1030 may itself be a distinct integrated circuit that is part of a number of integrated circuits that compose the communication transceiver 1010.

It is common to employ various amplifier and/or buffer stages within each of the paths (input and output) within the communication transceiver 1010. For example, each of the transmitter 1020 and the receiver 1030 is shown as including a plurality of such stages. Specifically, the transmitter 1020 is shown as having stage 1021, stage 1022, stage 1023, . . . , and stage 1024; the receiver 1030 is shown as having stage 1031, stage 1032, stage 1033, . . . , and stage 1034. Any one of these stages may be implemented according to a C3MOS wideband input data amplifier circuit that has been built.

However, in one particular stage of interest being the stage 1034 of the receiver 1030 (this being the input stage to the communication transceiver 1010), it is often desirable to perform appropriate impedance matching since this is the interface between the silicon of the communication transceiver 1010 and the package and/or board to which the communication transceiver 1010 communicatively couples. For example, it is the interface indicated by this stage 1034 at which any undesirable and deleterious reflections could arise if there is not appropriate impedance matching.

While it is noted that an embodiment of a C3MOS wideband input data amplifier circuit may be employed at any of the stages indicated within the transmitter 1020 and the receiver 1030 of the communication transceiver 1010, it may be of particular interest in a given application to use such a C3MOS wideband input data amplifier circuit at the stage 1034 of the receiver 1030 of the communication transceiver 1010 to ensure appropriate impedance matching. As described above, a designer is provided a great deal of latitude in designing an input matching impedance network for a C3MOS wideband input data amplifier circuit (including using inductors, capacitors, and/or resistors) to ensure appropriate impedance matching at this interface thereby reducing (if not eliminating completely) any undesirable and deleterious reflections.

It is also noted that certain aspects of the invention may be also included within a communication receiver device that does not have transmitter capability. Such an embodiment of a C3MOS wideband input data amplifier circuit can also be included in such a receiver device without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A current-controlled CMOS (C3MOS) wideband data amplifier circuit, the circuit comprising:

a first differential transistor comprising a source, gate, and drain;

a second differential transistor comprising a source, gate, and drain;

a current source that is coupled to both the source of the first differential transistor and the source of the second differential transistor;

a first output impedance, comprising a first output resistor and a first shunt peaking inductor connected in series, that is coupled between the drain of the first differential transistor and a supply voltage;

a second output impedance, comprising a second output resistor and a second shunt peaking inductor connected in series, that is coupled between the drain of the second differential transistor and the supply voltage;

a differential termination impedance that is coupled between the gate of the first differential transistor and the gate of the second differential transistor;

a first input impedance that is coupled between a first differential input of the C3MOS wideband data amplifier circuit and the gate of the first differential transistor; and a second input impedance that is coupled between a second differential input of the C3MOS wideband data amplifier circuit and the gate of the second differential transistor.

2. The circuit of claim 1, wherein:
the differential termination impedance comprises a first resistor and a second resistor connected in series.

3. The circuit of claim 1, wherein:
the first input impedance comprises a first series inductor; and
the second input impedance comprises a second series inductor.

4. The circuit of claim 1, wherein:
the first input impedance comprises a first plurality of inductors connected in series; and
the second input impedance comprises a second plurality of inductors connected in series.

5. The circuit of claim 1, wherein:
the first input impedance comprises a first series inductor and a first shunt capacitor; and
the second input impedance comprises a second series inductor and a second shunt capacitor.

6. The circuit of claim 1, wherein:
the first input impedance comprises a first plurality of inductors connected in series thereby generating a first plurality of nodes and a first plurality of shunt capacitors connected between selected nodes of the first plurality of nodes and a ground voltage; and
the second input impedance comprises a second plurality of inductors connected in series thereby generating a second plurality of nodes and a second plurality of shunt capacitors connected between selected nodes of the first plurality of nodes and a ground voltage.

7. The circuit of claim 1, wherein:
the first output resistor of the first output impedance is coupled between the drain of the first differential transistor and the first shunt peaking inductor of the first output impedance; and
the first shunt peaking inductor of the first output impedance is coupled between the first output resistor of the first output impedance and the supply voltage.

8. The circuit of claim 1, wherein:
the current source is a current source transistor; and
the first differential transistor, the second differential transistor, and the current source transistor comprise NMOS (Negative-Channel Metal-Oxide Semiconductor) transistors; or
the first differential transistor, the second differential transistor, and the current source transistor comprise PMOS (Positive-Channel Metal-Oxide Semiconductor) transistors.

9. The circuit of claim 1, further comprising:
a first capacitor that is coupled between the drain of the first differential transistor and the gate of the second differential transistor; and
a second capacitor that is coupled between the drain of the second differential transistor and the gate of the first differential transistor.

10. The circuit of claim 1, wherein:
the C3MOS wideband data amplifier circuit is an input amplifier stage of an integrated circuit.

11. The circuit of claim 10, wherein:
the integrated circuit is implemented within a receiver functional block of a communication transceiver.

12. A current-controlled CMOS (C3MOS) wideband data amplifier circuit, the circuit comprising:
a first differential input;
a second differential input;
a wideband differential transistor pair comprising a third differential input and a fourth differential input;
an input impedance matching network coupled to the first differential input of the C3MOS wideband data amplifier circuit, the second differential input of the C3MOS wideband data amplifier circuit, the third differential input of the wideband differential transistor pair, and the fourth differential input of the wideband differential transistor pair, wherein input impedance matching network comprises:
a differential termination impedance that is coupled between the third differential input of the wideband differential transistor pair and the fourth differential input of the wideband differential transistor pair;
a first input impedance that is coupled between the first differential input of the C3MOS wideband data amplifier circuit and the third differential input of the wideband differential transistor pair; and
a second input impedance that is coupled between the second differential input of the C3MOS wideband data amplifier circuit and the fourth differential input of the wideband differential transistor pair.

13. The circuit of claim 12, wherein the wideband differential transistor pair comprises:
a first differential transistor comprising a source, gate, and drain;
a second differential transistor comprising a source, gate, and drain;
a current source that is coupled to both the source of the first differential transistor and the source of the second differential transistor;
a first output impedance, comprising a first output resistor and a first shunt peaking inductor connected in series, that is coupled between the drain of the first differential transistor and a supply voltage;
a second output impedance, comprising a second output resistor and a second shunt peaking inductor connected in series, that is coupled between the drain of the second differential transistor and the supply voltage;
a first capacitor that is coupled between the drain of the first differential transistor and the gate of the second differential transistor; and
a second capacitor that is coupled between the drain of the second differential transistor and the gate of the first differential transistor; and wherein:
the third differential input of the wideband differential transistor pair comprises the gate of the first differential transistor; and
the fourth differential input of the wideband differential transistor pair comprises the gate of the second differential transistor.

14. The circuit of claim 12, wherein:
the differential termination impedance comprises a first resistor and a second resistor connected in series;
the first input impedance comprises a first series inductor; and the second input impedance comprises a second series inductor.

15. The circuit of claim 12, wherein:
the first input impedance comprises a first plurality of inductors connected in series; and
the second input impedance comprises a second plurality of inductors connected in series.

16. The circuit of claim 12, wherein:
the first input impedance comprises a first series inductor and a first shunt capacitor; and
the second input impedance comprises a second series inductor and a second shunt capacitor.

17. The circuit of claim 12, wherein:
the C3MOS wideband data amplifier circuit is an input amplifier stage of an integrated circuit; and
the integrated circuit is implemented within a receiver functional block of a communication transceiver.

18. A current-controlled CMOS (C3MOS) wideband data amplifier circuit, the circuit comprising:
a first differential transistor comprising a source, gate, and drain;
a second differential transistor comprising a source, gate, and drain;
a current source that is coupled to both the source of the first differential transistor and the source of the second differential transistor;
a first output impedance, comprising a first output resistor and a first shunt peaking inductor connected in series, such that the first output resistor is coupled between the drain of the first differential transistor and the first shunt peaking inductor, and the first shunt peaking inductor is coupled between the first output resistor and a supply voltage;
a second output impedance, comprising a second output resistor and a second shunt peaking inductor connected in series, such that the second output resistor is coupled between the drain of the second differential transistor and the second shunt peaking inductor, and the second shunt peaking inductor is coupled between the second output resistor and the supply voltage;
a first capacitor that is coupled between the drain of the first differential transistor and the gate of the second differential transistor;
a second capacitor that is coupled between the drain of the second differential transistor and the gate of the first differential transistor;
at least one resistor connected in series between the gate of the first differential transistor and the gate of the second differential transistor;
a first series inductor that is coupled between a first differential input of the C3MOS wideband data amplifier circuit and the gate of the first differential transistor; and
a second series inductor that is coupled between a second differential input of the C3MOS wideband data amplifier circuit and the gate of the second differential transistor.

19. The circuit of claim 18, wherein:
the current source is a current source transistor; and
the first differential transistor, the second differential transistor, and the current source transistor comprise NMOS (Negative-Channel Metal-Oxide Semiconductor) transistors; or
the first differential transistor, the second differential transistor, and the current source transistor comprise PMOS (Positive-Channel Metal-Oxide Semiconductor) transistors.

20. The circuit of claim 18, wherein:
the C3MOS wideband data amplifier circuit is an input amplifier stage of an integrated circuit; and
the integrated circuit is implemented within a receiver functional block of a communication transceiver.

* * * * *

UNITED STATES PATENT AND TRADEMARK OFFICE
CERTIFICATE OF CORRECTION

| | | |
|---|---|---|
| PATENT NO. | : 7,362,174 B2 | Page 1 of 1 |
| APPLICATION NO. | : 11/320402 | |
| DATED | : April 22, 2008 | |
| INVENTOR(S) | : Jun Cao | |

It is certified that error appears in the above-identified patent and that said Letters Patent is hereby corrected as shown below:

Column 1, line 20: replace "now abandoned." with --now expired.--

Signed and Sealed this

Nineteenth Day of August, 2008

JON W. DUDAS
*Director of the United States Patent and Trademark Office*